United States Patent
Alsmeier et al.

(10) Patent No.: US 6,265,278 B1
(45) Date of Patent: Jul. 24, 2001

(54) DEEP TRENCH CELL CAPACITOR WITH INVERTING COUNTER ELECTRODE

(75) Inventors: Johann Alsmeier, Wappingers Falls; Jack Allan Mandelman, Stormville; James Anthony O'Neill, New City; Christopher Parks, Beacon; Paul Christian Parries, Wappingers Falls, all of NY (US)

(73) Assignees: International Business Machines Corporation, Armonk, NY (US); Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/078,836

(22) Filed: May 14, 1998

Related U.S. Application Data

(62) Division of application No. 08/688,345, filed on Jul. 30, 1996, now Pat. No. 5,793,075.

(51) Int. Cl.$^7$ .................................................. H01L 21/20
(52) U.S. Cl. ........................ 438/386; 438/389; 438/391; 438/243; 438/246; 438/247; 438/248
(58) Field of Search .................... 438/243, 246, 438/247, 248, 386, 389, 391

(56) References Cited

U.S. PATENT DOCUMENTS

| | | | |
|---|---|---|---|
| 4,649,625 | 3/1987 | Lu | 29/571 |
| 4,688,063 | 8/1987 | Lu et al. | 357/23.6 |
| 4,694,561 * | 9/1987 | Lebowitz | 437/52 |
| 4,713,678 * | 12/1987 | Womach et al. | 357/23.6 |
| 4,728,623 | 3/1988 | Lu et al. | 437/52 |
| 4,761,385 | 8/1988 | Pfiester | 437/52 |
| 4,905,065 | 2/1990 | Selcuk et al. | 357/23.6 |
| 5,097,381 | 3/1992 | Vo | 361/313 |
| 5,103,276 | 4/1992 | Shen et al. | 357/23.6 |
| 5,198,383 | 3/1993 | Teng et al. | 437/47 |
| 5,198,995 | 3/1993 | Dennard et al. | 365/149 |
| 5,225,697 | 7/1993 | Malhi et al. | 257/302 |
| 5,250,829 | 10/1993 | Bronner et al. | 257/301 |
| 5,264,716 | 11/1993 | Kenney | 257/301 |
| 5,334,548 * | 8/1994 | Shen et al. | 437/52 |
| 5,349,218 * | 9/1994 | Tadaki et al. | 257/296 |
| 5,362,663 | 11/1994 | Bronner et al. | 437/52 |
| 5,422,294 | 6/1995 | Noble, Jr. | 437/52 |
| 5,485,027 | 1/1996 | Williams et al. | 257/343 |
| 5,675,160 | 10/1997 | Oikawa | 257/296 |
| 5,827,765 * | 10/1998 | Stengl et al. | 438/243 |
| 5,937,288 * | 8/1999 | Alsmeier et al. | 438/221 |
| 5,937,296 * | 8/1999 | Arnold | 438/270 |
| 5,981,332 * | 11/1999 | Mandelman et al. | 438/246 |
| 5,982,005 * | 11/1999 | Hidaka et al. | 257/347 |

OTHER PUBLICATIONS

Streetman, Ben G., *Solid State Electronic Devices*, Third Edition, Chapter 9, "Integrated Circuits", 1990, pp. 354–356.

\* cited by examiner

*Primary Examiner*—Matthew Smith
*Assistant Examiner*—Victor V. Yevsikov
(74) *Attorney, Agent, or Firm*—Schmeiser, Olsen & Watts; Daryl K. Neff

(57) ABSTRACT

The preferred embodiment provides an integrated circuit capacitor that achieves a high capacitance by using an inversion layer in the substrate as the plate counter electrode for the capacitor. The inversion layer is created by forming a trench capacitor in a lightly doped substrate. With a sufficient workfunction difference between the storage node material and the isolation band the surface of the lightly doped substrate inverts, with the inversion charge being supplied by the isolation band. This inversion layer serves as the plate counter electrode for the capacitor.

18 Claims, 4 Drawing Sheets

DEEP TRENCH CELL CAPACITOR WITH INVERTING COUNTER ELECTRODE

RELATED APPLICATIONS

This application is a divisional of a U.S. Patent Application entitled "Deep Trench Cell Capacitor with Inverting Counter Electrode", Ser. No. 08/688,345, filed on Jul. 30, 1996, now U.S. Pat. 5,793,075 which is incorporated herein by reference.

BACKGROUND OF THE INVENTION

1. Technical Field

This invention generally relates to integrated circuit capacitors, and more specifically relates to deep trench capacitors.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in Dynamic Random Access Memory (DRAM) markets. One particular area of concern in DRAM design is the storage capacitor used to store each memory cell. The density of DRAM designs is to a great extent limited to by the feature size of the storage capacitor. Capacitors by definition store charge between electrodes. In most integrated capacitors used in DRAM applications a "storage node" or "storage electrode" is connected to DRAM circuitry, while a "counter electrode" or "plate" is generally connected to a fixed potential.

The charge stored in the storage capacitor is subject to current leakage and for that reason the DRAM must be refreshed periodically. The time allowed between refresh without excess charge leakage is the data retention time, which is determined by the amount of charge stored at the beginning of the storage cycle and the amount of leakage current through different kinds of leakage mechanisms. For various reasons it is often preferable to minimize the leakage mechanisms so as to extend the time allowed between refresh cycles.

Several methods have been used to facilitate the shrinkage of the capacitor feature size while maintaining sufficient capacitance. For example, stacked capacitors have been located above the transfer devices. Unfortunately, this approach presents difficulties with topography and with connecting the capacitors.

Another approach has been the use of trench capacitors as storage capacitors. Trench capacitors extend the storage node into the substrate to increase the capacitance without increasing the area used on the device. The trench capacitor design typically uses a highly conductive single crystal silicon substrate as the counter electrode, and a highly conductive polycrystalline silicon in a deep trench as the storage electrode of the capacitor. By extending the capacitor in the vertical dimension trench capacitors allow the capacitor feature size to be decreased without decreasing the resulting capacitance.

The trench capacitor was further refined by the use of a substrate plate trench design. Referring to FIG. 1, there is shown a schematic cross-sectional view of the basic Substrate Plate Trench (SPT) DRAM cell described by Lu et al. U.S. Pat. No. 4,688,063 as modified by Bronner et al. in U.S. Pat. No. 5,250,829. The cell includes a substrate 10 of $P^+$ type semiconductor. A P well 12 is formed above an N isolation well 30. At the upper surface of the P well 12 a transfer device 14 is formed that includes a control gate 16 that is responsive to a word access line of the DRAM array support circuits, not shown. The transfer device 14 couples data between bit line diffused $N^+$ region 18 and diffused $N^+$ region 20 through the channel region formed in P well 12. A deep trench 22 is formed into the substrate 10, with deep trench 22 adjacent to $N^+$ region 20. Inside deep trench 22 is formed the capacitor storage node comprising $N^+$ type polysilicon electrode 24 isolated from substrate 10 by a thin dielectric layer. $N^+$ region 20 and the polysilicon storage node 24 are connected by a conductive strap 11. At the top of the storage trench 22 is a thick isolating collar 28 which serves to prevent vertical leakage. These features are further refined in U.S. Pat. No. 5,264,716 "Double Well Substrate Plate Trench DRAM Cell Array" and U.S. Pat. No. 5,362,663 "Method of Forming Double Well Substrate Plate Trench DRAM Cell Array," (each issued to Bronner et al. and assigned to International Business Machines Corp.).

In these prior art designs, substrate 10 serves as a common plate counter electrode for all the integrated capacitors on this device. The prior art has consistently taught that the substrate 10 should comprise highly doped material. This was to minimize a number of problems associated with the trench capacitor. For example, as feature size shrinks, one of the major problems is capacitance loss due to depletion effects at the electrodes. Most capacitor designs try to achieve the highest possible doping of both the node and/or the plate to minimize depletion effects at the electrodes. In particular, prior art approaches have used heavily $P_+$ substrates to minimize depletion effects with an P epitaxial layer on its top surface. The prior art thus taught that the doping of substrate 10 should generally be the maximum concentration of P dopants attainable by the wafer production process. This approach is successful at minimizing depletion effects but unfortunately leads to a less than favorable tradeoff between stored charge in the capacitor and the strength of the electric field in the dielectric.

Another prior art approach has been the use of a diffused region surrounding the deep trench as the capacitor counter electrode. These capacitors, commonly referred to as diffused plate capacitors, typically are able to achieve a relatively high capacitance with good reliability. Unfortunately, they require additional process steps to implement the diffused plate counter electrode.

Thus, the prior art suffers from the tradeoff between capacitance and reliability or requires excessive process complexity which creates a need for an improved capacitor design.

DISCLOSURE OF INVENTION

The present invention provides an integrated circuit capacitor that achieves a high capacitance by using an inversion layer in the substrate as the plate counter electrode for the capacitor. The inversion layer is created by forming a trench capacitor in a lightly doped substrate. With a sufficient workfunction difference between the storage node material and the isolation band the surface of the lightly doped substrate inverts, with the inversion charge being supplied by the isolation band. This inversion layer serves as the plate counter electrode for the capacitor.

It is thus an advantage of the present invention to provide a high capacitance, high reliability DRAM storage capacitor at low process complexity.

The foregoing and other advantages and features of the invention will be apparent from the following more particular description of a preferred embodiment of the invention, as illustrated in the accompanying drawing.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The preferred embodiment of the present invention overcomes the limitations of the prior art and provides a device and method to achieve a high capacitance in an integrated capacitor by using an inversion layer in the substrate as the plate electrode for the capacitor. For a given node dielectric thickness the preferred embodiment design provides higher capacitance and reliability, with reduced process complexity, than the prior art. The preferred embodiment of the present invention uses an inversion region as a counter electrode for a trench capacitor. This inversion layer is created by forming a trench capacitor in a lightly doped substrate. With a sufficient workfunction difference between the storage node material and the isolation band the surface of the lightly doped substrate inverts, with the inversion charge being supplied by the isolation band.

Figure 1:
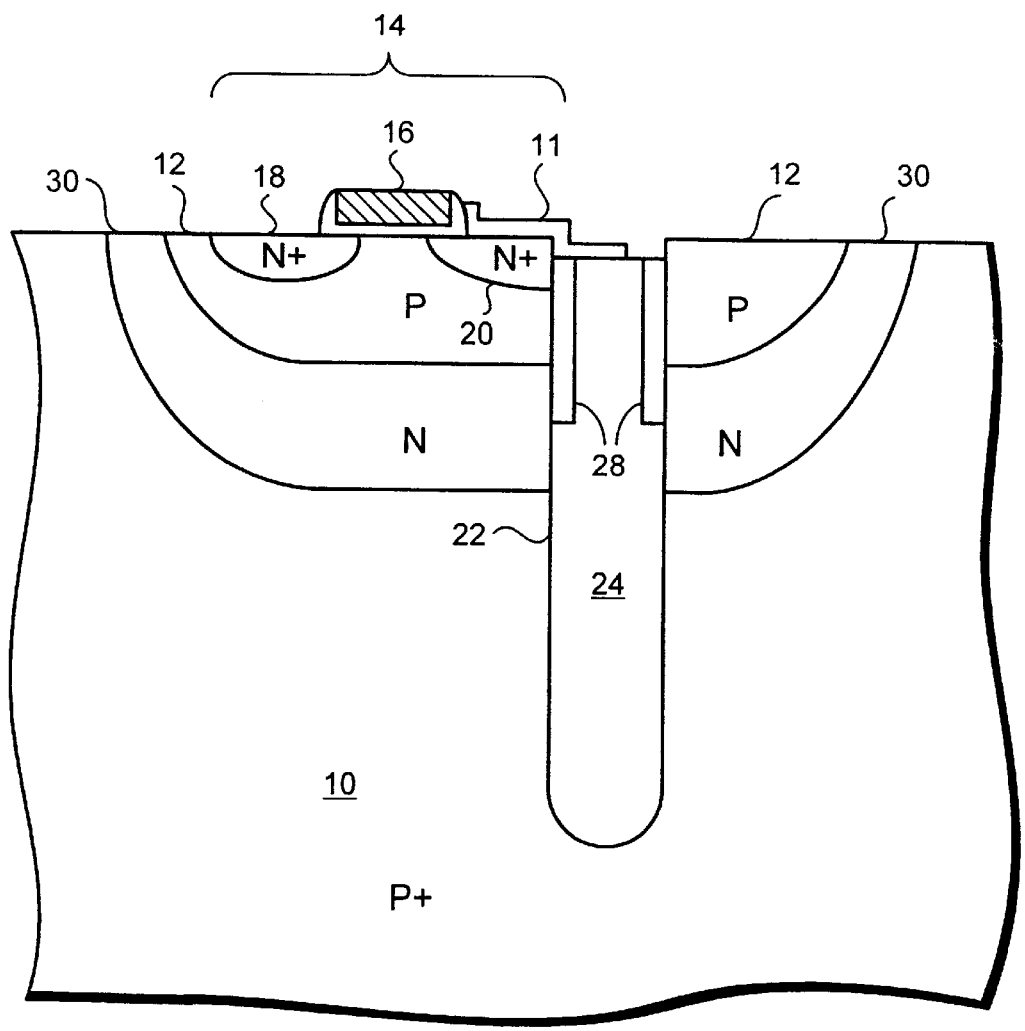
FIG. 1 is a cross sectional schematic view of a prior art trench capacitor.
Figure 2:
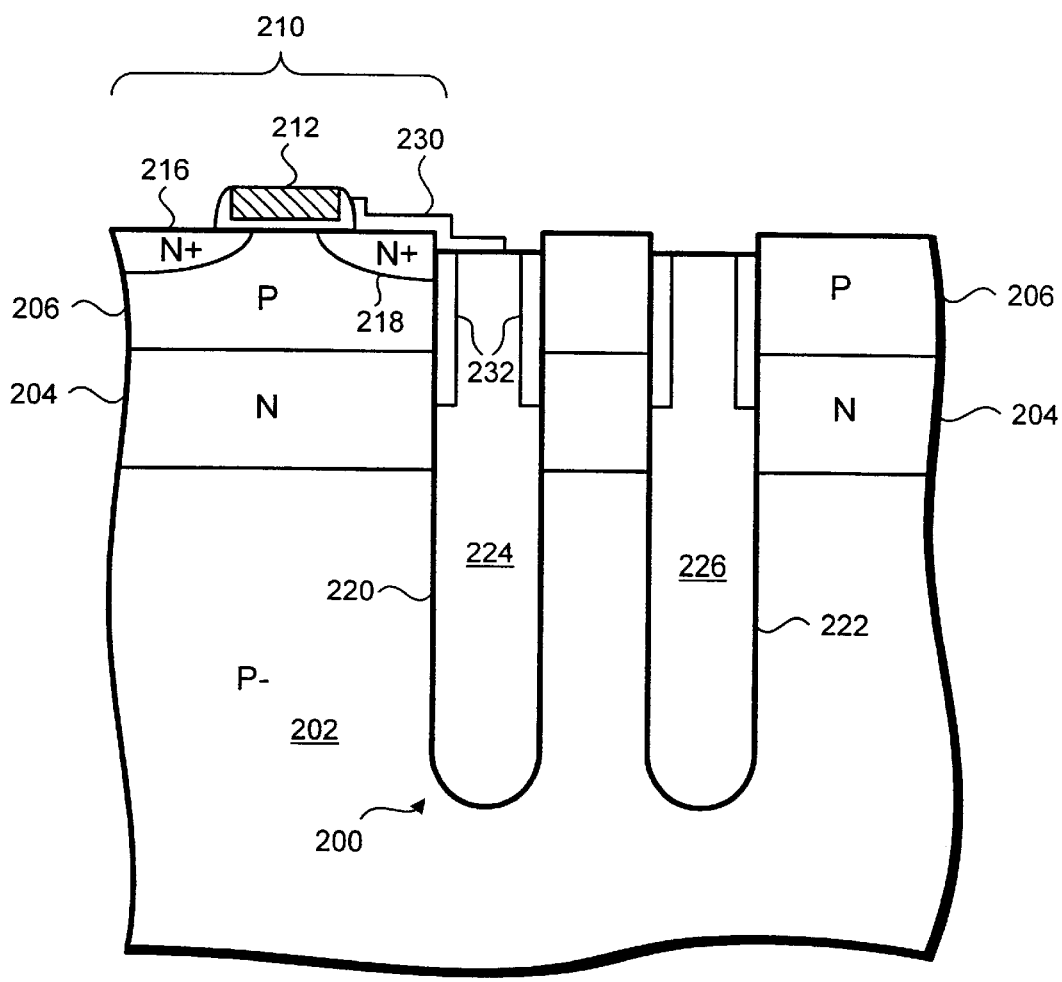
FIG. 2 is a cross sectional schematic view of an inverting node capacitor in accordance with the preferred embodiment of the present invention.

Turning now to FIG. 2, FIG. 2 is a cross sectional schematic view of an inverting node capacitor 200 in accordance with the preferred embodiment of the present invention. The illustrated embodiment is a trench capacitor 200 configured for use in a DRAM portion 201. However, those skilled in the art will recognize that the scope of the present invention is not limited DRAM applications or trench capacitors.

The DRAM portion 201 is formed in a substrate 202 of $P^-$ semiconductor material. As part of the DRAM portion 201, an inverting node capacitor 200 is formed in substrate 202 of $P^-$ semiconductor material. A P well 206 is formed above an N isolation band 204. At the upper surface of the P well 206 a transfer device 210 is formed. The transfer device 210 is typically a field effect device common in DRAM devices. The transfer device 210 couples charge to and from capacitor 200. The transfer device 210 includes a gate 212 and diffused $N^+$ regions 216 and 218. Gate 212 is typically tied to the word access line of the DRAM device support circuits, not shown. Likewise, the diffused $N^+$ region 216 is typically tied to bit access lines on the DRAM device support circuits, not shown, and $N^+$ region 218 completes the transfer device 210. In operation the transfer device 210 couples data between the bitline and capacitor 200 through a channel region formed under gate 212 in P well 206.

A deep trench 220 is formed extending through the N isolation band into the substrate 202, with deep trench 220 adjacent to diffused $N^+$ region 218. Inside the deep trench 220 is formed the capacitor storage node 224. Storage node 224 preferably comprises $N^+$ polysilicon. Of course, other suitable storage node conducting materials, such as $P^+$ polysilicon in the complementary device could be used. The storage node 224 is isolated from substrate 202 by a thin capacitor dielectric layer (illustrated by the thickened lining of trench 220), that preferably covers the entire inside of the trench. The thin dielectric layer can comprise any suitable dielectric, such as various nitride films (NO, ONO, NONO). Diffused $N^+$ region 218 and storage node 224 are connected by a conductive strap 230. At the top of trench 220 is a thick isolating collar 232, typically formed from a dielectric material such as silicon dioxide ($SiO_2$).

In the illustrated embodiment, a second deep trench 222 with a storage node 226 is formed as part of an adjacent capacitor (the transfer device connecting to the adjacent capacitor not shown in FIG.2). The adjacent capacitor is preferably substantially identical to the capacitor 200, and thus storage node 222 is substantially identical to storage node 220.

Figure 3:
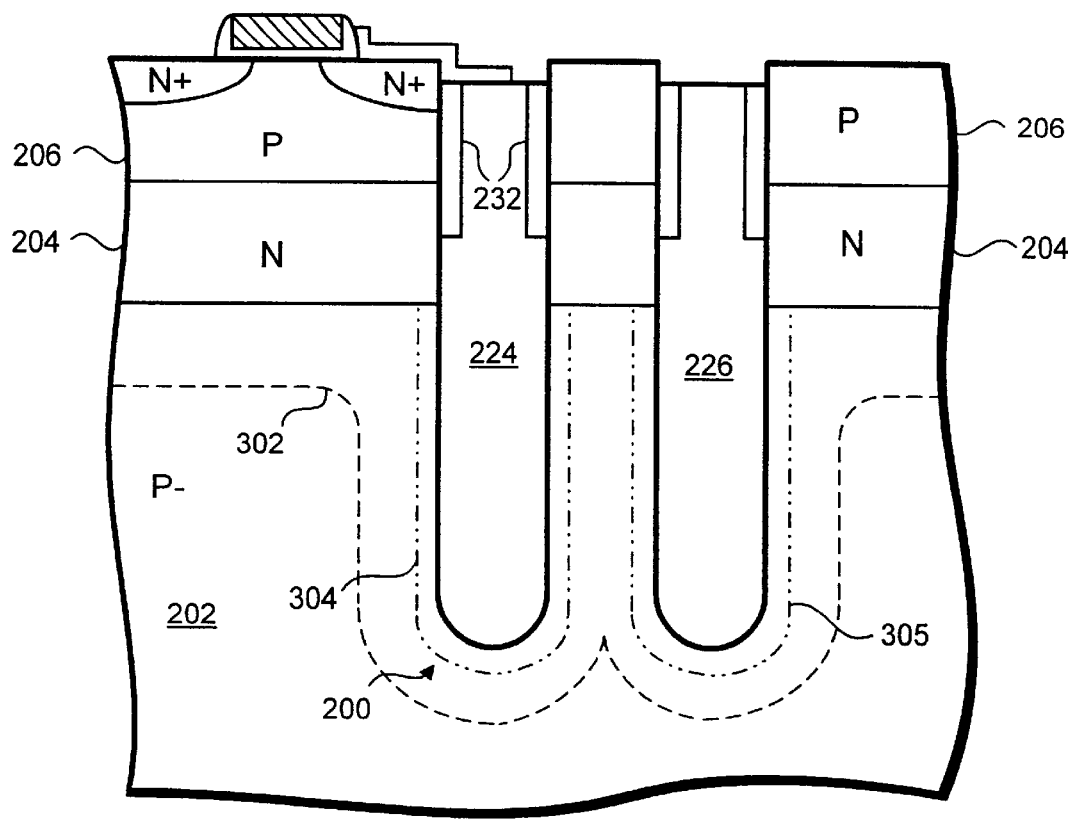
FIG. 3 is a second cross sectional schematic view of an inverting node capacitor in accordance with the preferred embodiment of the present invention illustrating a depletion and inversion region.

Thus formed, the preferred embodiment provides a novel form of counter electrode for an integrated capacitor. Turning to FIG. 3, FIG. 3 is a second cross sectional schematic view of inverting node capacitor 200. By forming the capacitor 200 in a $P^-$ substrate 202, a depletion region 302 is formed around the storage nodes 224 and adjacent to N isolation band 204. Likewise, the depletion region 302 also is formed around the storage nodes of the other capacitors fabricated into substrate 202, such as storage node 226 of the adjacent capacitor. Inside the depletion region proximate storage node 224 is formed an inversion region 304. Likewise, proximate storage node 226, an inversion region 305 is formed. The inversion region 304 serves as the plate counter electrode for the inverting node capacitor 200. Likewise, the inversion region 305 serves as the plate counter electrode for the adjacent capacitor. In the preferred embodiment, the inversion region counter electrodes are all tied together through the N isolation band 204, and form a common counter electrode for the DRAM capacitors.

The inversion region 304 is connected to the N isolation band, and as such the electric field between the storage node 224 and the inversion region 304 counter electrode is partially determined by the workfunction difference between the N isolation band and the $N^+$ material in storage node 224. This allows greater charge to be stored in the capacitor for a given dielectric thickness and electric field in the dielectric, as will be demonstrated later.

In particular, depletion region 302 is formed by a combination of a workfunction difference between the storage node 224 material and the N isolation band 204 material, the biasing of the storage node 224 relative to N isolation band 202, and the charge induced into the capacitor dielectric film during processing. In particular, when a sufficient workfunction difference or a combination workfunction/bias difference exists between storage nodes 224 and 226 and the N isolation band 204, depletion region 302 is formed. When the difference is large enough and the substrate is a lightly doped material, the depletion layer grows until electrons (which flow from N isolation band 204) flow into depletion region 302 and form a negatively charged layer, called an inversion region 304. The inversion region 304 is formed adjacent to the capacitor dielectric and proximate the storage nodes 224.

However, in the preferred embodiment, depletion region 302 and inversion region 304 are formed by the workfunction difference between the storage nodes 224 and 226 material and the N isolation band 204 material and by insulator or interface charge without any applied bias difference between the storage nodes 224 and the N isolation band 204. Inversion occurs when the storage node 224 comprises highly doped $N^+$ type material, when the N isolation band 204 is a lower N-type doping concentration and when the substrate is lightly doped $P^-$ material, even when the applied voltage between the $N^+$ storage node and the N isolation band 204 is zero.

Stated another way, it is preferable that the threshold voltage Vt of the inversion region be less than zero. The threshold voltage Vt is the potential that must be applied to the storage nodes relative to the N isolation band 204 for inversion region 304 to form. Thus, it is preferable when using inversion region 304 as the capacitor counter electrode that the inversion region 304 form when little or no potential difference exists between storage node 224 and N isolation band 204. Suitably however, the threshold voltage Vt can be slightly greater than zero. The threshold voltage Vt is at least partially determined by the relative doping of the substrate 202 and the type and thickness of the dielectric layer between the storage node and substrate 202.

Thus, the surface of the lightly doped substrate inverts, with the inversion charge supplied by the N isolation band 204. In the preferred embodiment with the storage nodes comprising $N^+$ material such as polysilicon and substrate comprising a lightly doped, $P^-$ material, with a very thin dielectric material between them, the structure "turns on" and forms the inversion region 304 even with no externally applied potential, i.e., the threshold voltage Vt is less than zero. Because inversion region 304 is the counter electrode, as charge is added to the storage node 224 the charge in the inversion region 304 increases correspondingly. In the preferred embodiment of the present invention the inversion region 304 serves as the capacitor counter electrode.

For the threshold voltage Vt to be less than zero, the substrate 202 doping is suitably between $1 \times 10^{14}$ and $1 \times 10^{17}$ ions/cm$^3$ and preferably between $1 \times 10^{15}$ and $5 \times 10^{15}$ ions/cm$^3$ with boron as the dopant. Additionally, the storage node doping is suitably greater than $5 \times 10^{19}$ ions/cm$^3$ and preferably greater than $1 \times 10^{20}$ ions/cm$^3$ with arsenic or phosphorus as dopant. The peak concentration of ions in the N isolation band 204 is typically 1–5$\times 10^{18}$ ions/cm$^3$.

Thus the inversion region 304 is formed by a transistor-like action with the N isolation band 204 supplying the inversion electrons and hence analogous to the source on a field effect transistor. The N isolation band 204 thus serves as the wiring connection to the inversion region 304 common counter electrode of capacitor 200. Because the N isolation band 204 serves as the connection to the inversion region 304 counter electrode, as well as the source of electrons to form the inversion region 304, the conductivity of the N isolation band 204 is more critical than in prior art designs. In particular, the sheet resistance of the N isolation band 204 should be less than or equal to 1000 ohms/sq to assure that access delays are not more 1 nanosecond. Thus, the N isolation band 204 suitably has a doping dose level between $1 \times 10^{13}$ and $20 \times 10^{13}$ ions/cm$_2$. Preferably, the N isolation band 204 formed by implanting phosphorus at about $5 \times 10^{13}$ ions/cm$^2$ at about 1000 KEV.

In typical DRAM applications the P well 206 is biased at −1 volts, while the substrate 202 is biased at 0 volts. The N isolation band is also biased at 0 volts and serves to isolate these two differently biased regions as well as providing the source of electrons for inversion region 304.

The total charge stored by the capacitor is partially determined by the doping level of the substrate 202, and hence the threshold voltage Vt of the inverting node. The amount of capacitance in capacitor 200 is not significantly affected by the threshold voltage Vt of the $P^-$ substrate 202 doping as long as the threshold voltage Vt is less than zero.

The isolation collar 232 act as a spacer to prevent an inversion layer forming adjacent the storage node 224 inside the P well 206. Otherwise, a potential difference between storage node 224 and the N isolation band 204 could form an inversion layer in P well 206, resulting in signal leakage. For this reason, the isolation collar 232 must comprise a relatively thick dielectric such as $SiO_2$, and must extend below the bottom of P well 206. The collar 232 should not however, extend below the bottom of N isolation layer 204 to ensure good continuity to the inversion layer around the trench.

Figure 4:
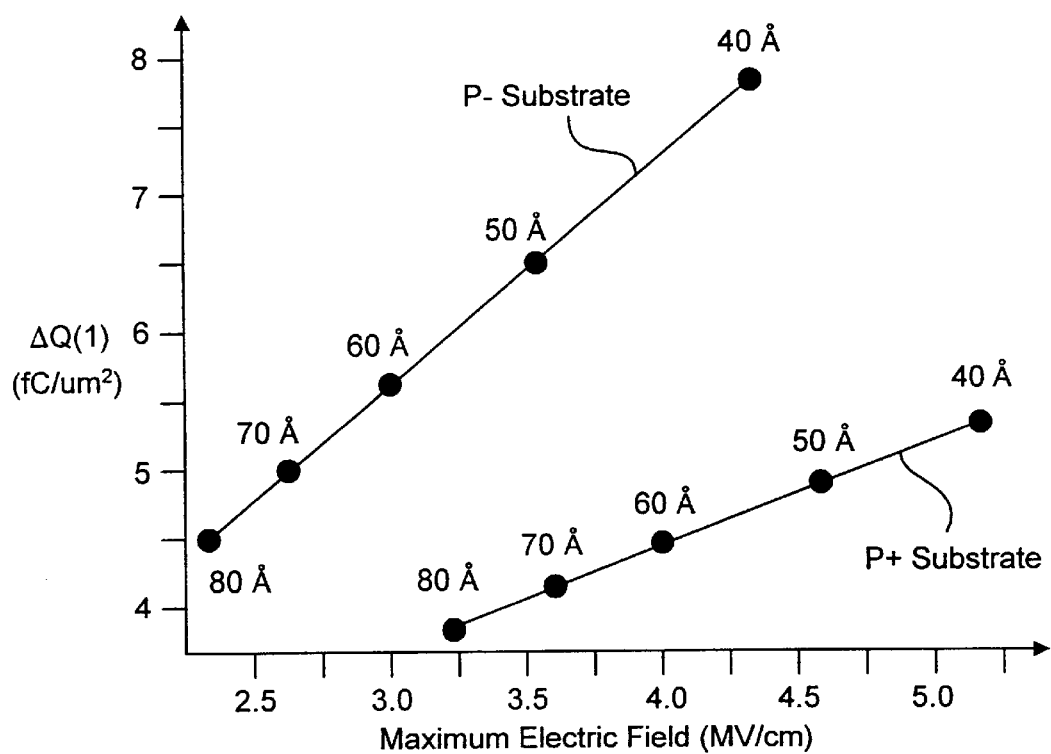
FIG. 4 is a graph showing a plot of maximum electric fields in MV/cm verses the stored charge on a inverting node capacitor with $P^-$ substrate and a prior art substrate plate trench capacitor with a $P^+$ substrate.

Turning now to FIG. 4, FIG. 4 is a graph showing a plot of stored charge (fC/$\mu$m$^2$) vs. maximum electric fields (MV/cm) on an inverting node capacitor with $P^-$,substrate and a prior art substrate plate trench capacitor with a $P^+$ substrate. In integrated capacitor design a critical design parameter is the amount of charge stored on the capacitor that is available to be read by the DRAM sense amplifiers when reading a "1" from the capacitor. In a typical DRAM application the amplifier detects relative charge on the storage capacitor. In typical designs, the typical voltage swing on the storage capacitor between a "1" and a "0" is two volts. Thus, the charge available to detect a "1", $\Delta Q(1)$, is typically defined as:

$$\Delta Q(1) = \int_{\frac{Vdd}{2}}^{Vdd} C\,dv$$

where C is the capacitance of the integrated capacitor and Vdd/2 is the pre-charge voltage on the bitline. It is generally preferable to make the charge $\Delta Q(1)$ as high as possible to give the signal a higher signal-to-noise ratio. However, another critical design parameter is the electric field in the dielectric. An electric field that is too strong can cause the dielectric to prematurely wear out or otherwise breakdown. FIG. 4 illustrates that the preferred embodiment capacitor with a $P^-$ substrate ($1.5 \times 10^{15}$ ions/cm$^3$) is able to achieve a greater charge storage with less electric field for a given dielectric thickness than a prior art $P^+$ substrate ($1.5 \times 10^{19}$ ions/cm$^3$). Thus, the preferred embodiment capacitor can be reduced in size further and still maintain sufficient charge storage capacity and reliability compared to prior art designs. Because the $P^-$ substrate inverts, the dielectric field in the capacitor sees the N isolation band 204, (by way of the inversion layer 304) which has a lessor workfunction difference relative the $N^+$ storage node than a $P^+$ substrate. In particular, the $P^+$ substrate capacitor has a higher dielectric field because of the extra ~1V workfunction difference of the $P^+$ substrate relative to the N isolation band 204 that is seen through the inversion layer 304 with the $P^-$ substrate.

The preferred embodiment of the present invention thus provides an improved capacitor structure that overcomes the limitations of the prior art. In particular, because the plate counter electrode is the inversion region 304 instead of a the substrate itself as in prior art designs, higher capacitance and improved tolerance for a given reliability is attained.

Thus, the preferred embodiment offers an improved integrated capacitor design with less leakage current and more capacitance. While the invention has been particularly shown and described with reference to a preferred exemplary embodiment with a trench design, it will be understood by those skilled in the art that various changes in form and details may be made therein without departing from the spirit and scope of the invention.

For example, while the preferred embodiment has been described with reference to a P⁻ substrate, an N isolation band and an N⁺ storage node, the design is equally applicable to the complementary case. Specifically, the complementary case uses an N⁻ substrate, a P isolation band and a P⁺ storage node. The doping levels for this embodiment would mirror those in the preferred P⁻ substrate design. In this embodiment, the P isolation band supplies holes which form an inversion layer in the N− substrate.

Additionally, while the preferred embodiment has been described with respect to a capacitor for use in a DRAM system, the inverting node capacitor can be used in other integrated capacitor applications where high capacitance, high reliability and reduced process complexity are required.

What is claimed is:

1. A method of making an integrated circuit capacitor comprising the steps of:
   a) providing a P⁻ substrate;
   b) forming a N isolation band in a portion of said P⁻ substrate;
   c) forming a N⁺ type trench storage node extending through said N isolation band and into said P⁻ substrate, and wherein an inversion region is formed in said P⁻ substrate proximate said N⁺ type trench storage node with carriers supplied from said N isolation band, said inversion region comprising a counter electrode for said integrated circuit capacitor.

2. The method of claim 1 wherein said storage node comprises N⁺ type material doped greater than $5\times10^{19}$ ions/cm³ and wherein said lightly doped substrate comprises P⁻ type material doped between $1\times10^{14}$ and $1\times10^{17}$ ions/cm³ and wherein the step of forming said N type isolation band comprises providing a doping dose between $1\times10^{13}$ and $20\times10^{13}$ ions/cm².

3. The method of claim 1 wherein said storage node comprises N⁺ type material doped greater than $1\times10^{20}$ ions/cm³ and wherein said lightly doped substrate comprises P⁻ type material doped between $1\times10^{15}$ and $5\times10^{15}$ ions/cm³ and wherein the step of forming said N type isolation band comprises providing a doping dose of about $5\times10^{13}$ ions/cm².

4. A method of making an integrated circuit capacitor comprising the steps of:
   a) providing a N⁻ substrate;
   b) forming a P isolation band in a portion of said N⁻ substrate;
   c) forming a P⁺ type trench storage node extending through said P isolation band and into said N⁻ substrate, and wherein an inversion region is formed in said N⁻ substrate proximate said P⁺ type trench storage node with carriers supplied from said P isolation band, said inversion region comprising a counter electrode for said integrated circuit capacitor.

5. The method of claim 4 wherein said storage node comprises P⁺ type material doped greater than $5\times10^{19}$ ions/cm³ and wherein said lightly doped substrate comprises N⁻ type material doped between $1\times10^{14}$ and $1\times10^{17}$ ions/cm³ and wherein the step of forming said P type isolation band comprises providing a doping dose between $1\times10^{13}$ and $20\times10^{13}$ ions/cm².

6. The method of claim 4 wherein said storage node comprises P⁺ type material doped greater than $1\times10^{20}$ ions/cm³ and wherein said lightly doped substrate comprises N⁻ type material doped between $1\times10^{15}$ and $5\times10^{15}$ ions/cm³ and wherein the step of forming said P type isolation band comprises providing a doping dose of about $5\times10^{13}$ ions/cm².

7. A method for making an integrated circuit capacitor comprising the steps of:
   a) providing a substrate;
   b) forming a storage node extending into said substrate;
   c) forming a dielectric between said storage node and said substrate; and
   d) forming an inversion region in said substrate surrounding said storage node, said inversion region forming a counter electrode for said capacitor.

8. The method of claim 7 wherein the step of forming an inversion region comprises forming said inversion region without applying a bias to said storage node.

9. The method of claim 7 further comprising the step of forming an isolation layer in said substrate, and wherein said isolation layer supplies charge carriers for said inversion layer.

10. The method of claim 9 wherein the step of forming an isolation layer forms a connection to said counter electrode, wherein said connection to said counter electrode is used to determine the potential of said counter electrode.

11. The method of claim 9 wherein the step of forming said isolation layer comprises forming an N type material with a doping dose between $1\times10^{13}$ and $20\times10^{13}$ ions/cm² and wherein said charge carriers supplied to said inversion layer comprises electrons.

12. The method of claim 9 wherein the step of forming said isolation layer comprises forming an N type material with a doping dose of about $5\times10^{13}$ ions/cm² and wherein said charge carriers supplied to said inversion layer comprises electrons.

13. The method of claim 9 wherein the step of forming said isolation layer comprises forming a P type material with a doping dose between $1\times10^{13}$ and $20\times10^{13}$ ions/cm² and wherein said charge carriers supplied to said inversion layer comprise holes.

14. The method of claim 9 wherein the step of forming said isolation layer comprises forming a P type material with a doping dose of about $5\times10^{13}$ ions/cm² and wherein said charge carriers supplied to said inversion layer comprise holes.

15. The method of claim 7 wherein the step of forming said storage node comprises doping semiconductor material in said storage node greater than $5\times10^{19}$ ions/cm³ and wherein the step of providing said lightly doped substrate comprises providing a substrate doped between $1\times10^{14}$ and $1\times10^{17}$ ions/cm³.

16. The method of claim 7 wherein the step of forming said storage node comprises doping semiconductor material in said storage node greater than $1\times10^{20}$ ions/cm³ and wherein the step of providing said lightly doped substrate comprises providing a substrate doped between $1\times10^{15}$ and $5\times10^{15}$ ions/cm³.

17. The method of claim 7 wherein the step of forming said counter electrode comprises forming a common counter electrode.

18. The method of claim 7 wherein the step of providing a substrate comprises providing a lightly doped substrate.

* * * * *